(12) United States Patent
Hsueh

(10) Patent No.: US 8,194,335 B2
(45) Date of Patent: Jun. 5, 2012

(54) OPTICAL LENS ON WAFER LEVEL AND RELATED METHOD FOR FORMING THE OPTICAL LENS ONE WAFER LEVEL

(75) Inventor: Chuan-Ching Hsueh, Tainan County (TW)

(73) Assignee: Himax Technologies Limited, Xinshi Dist., Tainan (TW)

( * ) Notice: Subject to any disclaimer, the term of this patent is extended or adjusted under 35 U.S.C. 154(b) by 64 days.

(21) Appl. No.: 12/758,807

(22) Filed: Apr. 13, 2010

(65) Prior Publication Data

US 2011/0249350 A1    Oct. 13, 2011

(51) Int. Cl.
*G02B 7/02*    (2006.01)
(52) U.S. Cl. ........................ 359/811; 359/819
(58) Field of Classification Search .................. 359/811, 359/819, 820, 621, 623, 619; 385/31, 88, 385/92, 93; 349/187–190, 149, 158; 257/432, 257/434, 506; 347/233, 237; 438/5, 107
See application file for complete search history.

(56) References Cited

U.S. PATENT DOCUMENTS

| | | | | |
|---|---|---|---|---|
| 5,617,131 A | * | 4/1997 | Murano et al. | 347/233 |
| 5,747,363 A | * | 5/1998 | Wei et al. | 438/5 |
| 6,646,807 B2 | * | 11/2003 | Yoshikawa et al. | 359/619 |
| 6,693,748 B1 | * | 2/2004 | Fujimoto et al. | 359/621 |
| 7,025,511 B2 | * | 4/2006 | Nakajima | 385/93 |
| 7,391,572 B2 | * | 6/2008 | Jacobowitz et al. | 359/619 |
| 7,612,954 B2 | * | 11/2009 | Lin | 359/819 |
| 2010/0117181 A1 | * | 5/2010 | Kim et al. | 257/432 |

* cited by examiner

*Primary Examiner* — Loha Ben
(74) *Attorney, Agent, or Firm* — Winston Hsu; Scott Margo

(57) ABSTRACT

An optical lens on wafer level consists of a first optical component, a first spacer, a second optical component, at least a first via plug, and an adhesion material. The first spacer includes at least a first via plug passing through the first spacer, wherein the first optical component and the second optical component are separated by the first spacer. The adhesion material is coated in between the first optical component and the first spacer and coated in between the first spacer and the second optical component, and is filled in at least a portion of the first via plug.

16 Claims, 5 Drawing Sheets

OPTICAL LENS ON WAFER LEVEL AND RELATED METHOD FOR FORMING THE OPTICAL LENS ONE WAFER LEVEL

BACKGROUND OF THE INVENTION

1. Field of the Invention

The present invention relates to an optical lens on wafer level and a related method, and more particularly, to an optical lens on wafer level and a related method for improving adhesion between optical components by filling via plugs with adhesion material in between two optical components or in between two spacers.

2. Description of the Prior Art

With advancement of optics technology, image-capturing devices are more and more popular. Beside digital cameras, mobile devices such as mobile phones, personal digital assistants, and notebooks also have image-capturing functions installed.

An optical lens is one of the most important components in the image-capturing device. Recently, when manufacturing the optical lens on wafer level, only glue is coated between optical components to bond the optical components. However, if a quality test is performed on such optical lens, the optical components of the optical lens may fall off due to temperature or humidity factor.

Hence, improving the adhesion between the optical components has become considerations for the future.

SUMMARY OF THE INVENTION

It is one of the objectives of the claimed invention to provide an optical lens on wafer level and a related method for forming the optical lens on wafer level to solve the above-mentioned problems.

According to one embodiment, an optical lens on wafer level is provided. The optical lens consists of a first optical component, a first spacer, a second optical component, and an adhesion material. The first spacer including at least a first via plug passing through the first spacer, wherein the first optical component and the second optical component are separated by the first spacer. The adhesion material is coated in between the first optical component and the first spacer and coated in between the first spacer and the second optical component, and is filled in at least a portion of the first via plug. The first optical component can be a diaphragm, a lens plate, or an image sensor. The second optical component can be a diaphragm, a lens plate, or an image sensor.

According to another embodiment, an optical lens on wafer level is provided. The optical lens consists of a first spacer, an optical component, a second spacer, and an adhesion material. The optical component is located in between the first spacer and the second spacer, wherein the optical component includes at least one via plug passing through the optical component. The adhesion material is coated in between the first spacer and the optical component and coated in between the optical component and the second spacer, and is filled in at least a portion of the via plug.

According to another embodiment, a method for forming an optical lens on wafer level is provided. The method includes the steps of providing a first optical component and a second optical component; inserting a first spacer in between the first optical component and the second optical component, so that the first optical component and the second optical component are separated by the first spacer; disposing at least a first via plug upon the first spacer, wherein the first via plug passes through the first spacer; and coating an adhesion material in between the first optical component and the first spacer to bond the first optical component and the first spacer, and coating the adhesion material in between the first spacer and the second optical component to bond the first spacer and the second optical component, wherein the adhesion material is filled in at least a portion of the first via plug.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the following description and claims to refer to particular components. As one skilled in the art will appreciate, hardware manufacturers may refer to a component by different names. This document does not intend to distinguish between components that differ in name but in function. In the following discussion and in the claims, the terms "include", "including", "comprise", and "comprising" are used in an open-ended fashion, and thus should be interpreted to mean "including, but not limited to . . . ". The terms "couple" and "coupled" are intended to mean either an indirect or a direct electrical connection. Thus, if a first device couples to a second device, that connection may be through a direct electrical connection, or through an indirect electrical connection via other devices and connections.

Figure 1:
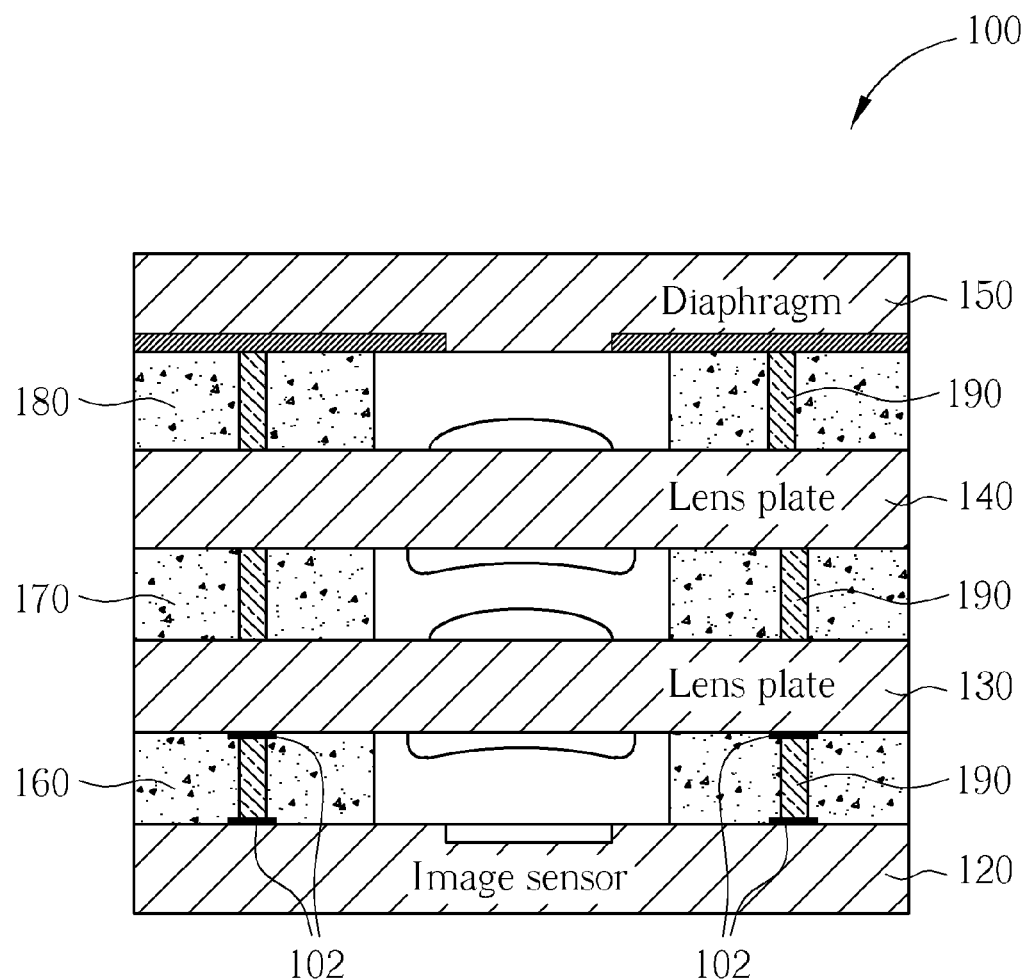
FIG. 1 is a cross-sectional view of an architecture of an optical lens on wafer level according to a first embodiment of the present invention.

FIG. 1 is a cross-sectional view of an architecture of an optical lens 100 on wafer level according to a first embodiment of the present invention. The optical lens 100 includes, but is not limited to, a plurality of optical components 120-150, a plurality of spacers 160-180, and at least one via plug 190. As shown in FIG. 1, the plurality of optical components consists of an imager sensor 120, a first lens plate 130, a second lens plate 140, and a diaphragm 150. The optical components 120-150 are separated by the first spacer 160, the second spacer 170 and the third spacer 180. As an illustration, the image sensor 120 and the first lens plate 130 are separated by the first spacer 160; the first lens plate 130 and the second lens plate 140 are separated by the second spacer 170; and the second lens plate 140 and the diaphragm 150 are separated by the third spacer 180. Be noted that, in this embodiment, the first spacer 160, the second spacer 170 and the third spacer 180 each has at least one via plug 190 passing through them. In other words, any spacer (e.g., 160-180), which is located in between two optical components for separating these two optical components, may have at least one via plug 190.

Furthermore, an adhesion material is coated in between any one of the optical components 120-150 and any one of the spacers 160-170, and is filled in at least a portion of the via plugs 190. For example, the adhesion material 102 is coated in between the imager sensor 120 and the first spacer 160 to bond the imager sensor 120 and the first spacer 160, and between the first spacer 160 and the lens plate 130. Therefore, by filling the via plugs 190 with adhesion material in between any two optical components, the adhesion between the two optical components can be improved.

Please note that the optical lens can be a compact camera module (CCM), but this should not be considered as a limitation of the present invention. The optical lens 100 can be disposed in an image-capturing device, but the present invention is not limited this only. In addition, the position, the size and the number of the via plugs 190 are not limited. That is, various modifications of the position, the size and the number of the via plugs 190 may be made without departing from the spirit of the present invention, which also belongs to the scope of the present invention.

In one embodiment, the adhesion material can consist of Epoxy Resin. But the present invention is not limited to this only and other materials might be adopted to bond the optical components and the spacers of the optical lens 100. In addition, the type of the optical components is not limited in the present invention.

Figure 2:
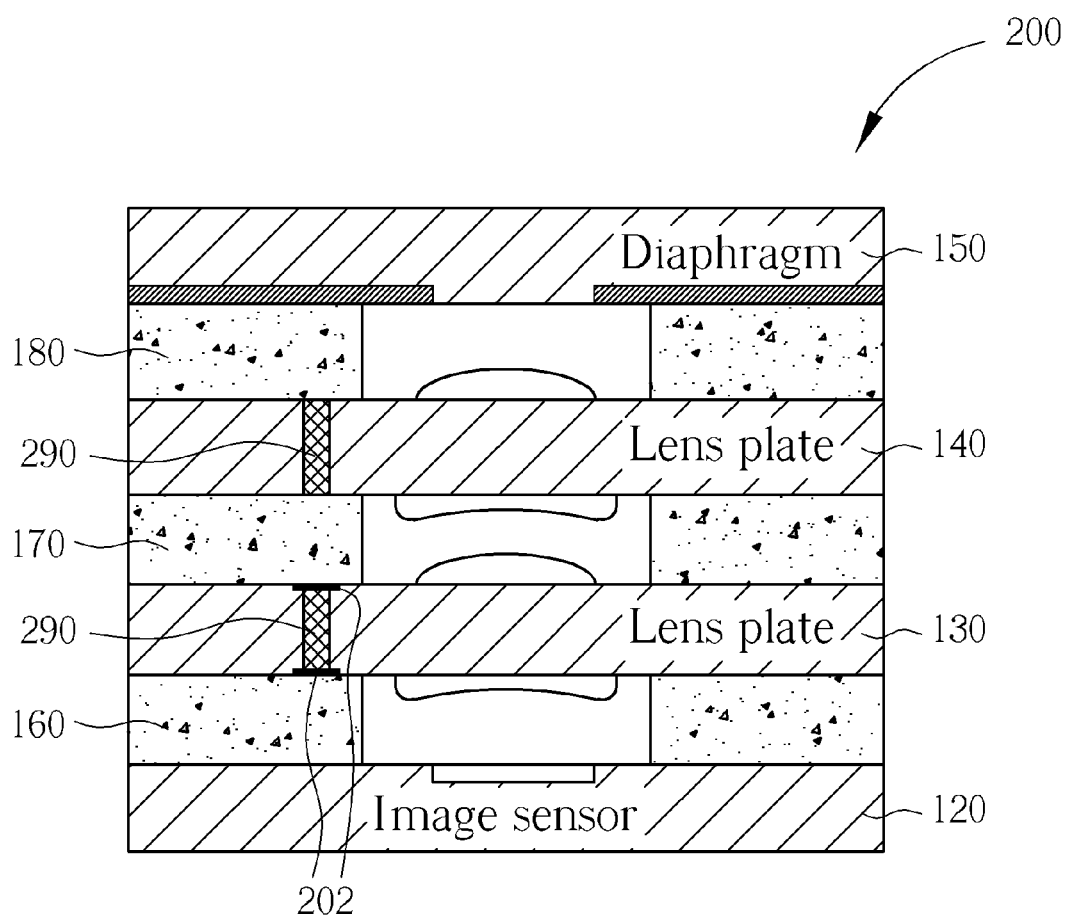
FIG. 2 is a cross-sectional view of an architecture of an optical lens on wafer level according to a second embodiment of the present invention.

FIG. 2 is a cross-sectional view of an architecture of an optical lens on wafer level according to a second embodiment of the present invention. As shown in FIG. 2, the architecture of the optical lens 200 on wafer level is similar to that of the optical lens 100 shown in FIG. 1. In this embodiment, the optical lens 200 includes a plurality of optical components 120-150, a plurality of spacers 160-180, and at least one via plug 290. As shown in FIG. 2, the optical components 120-150 are separated by the first spacer 160, the second spacer 170 and the third spacer 180. Be noted that, in this embodiment, the first lens plate 130 and the second lens plate 140 each has at least one via plug 290 passing through them. In other words, any optical component (e.g., 130 and 140), which is located in between two spacers, may have at least one via plug 290 passing through it. Furthermore, the adhesion material is coated in between any one of the optical components 120-150 and any one of the spacers 160-170 (for example, the adhesion material 202 is coated in between the first lens plate 130 and the first spacer 160, and between the second spacer 170 and the first lens plate 130), and is filled in at least a portion of the via plugs 290. Therefore, by filling the via plugs 290 with adhesion material in between any two spacers, the adhesion between them can be improved.

Figure 3:
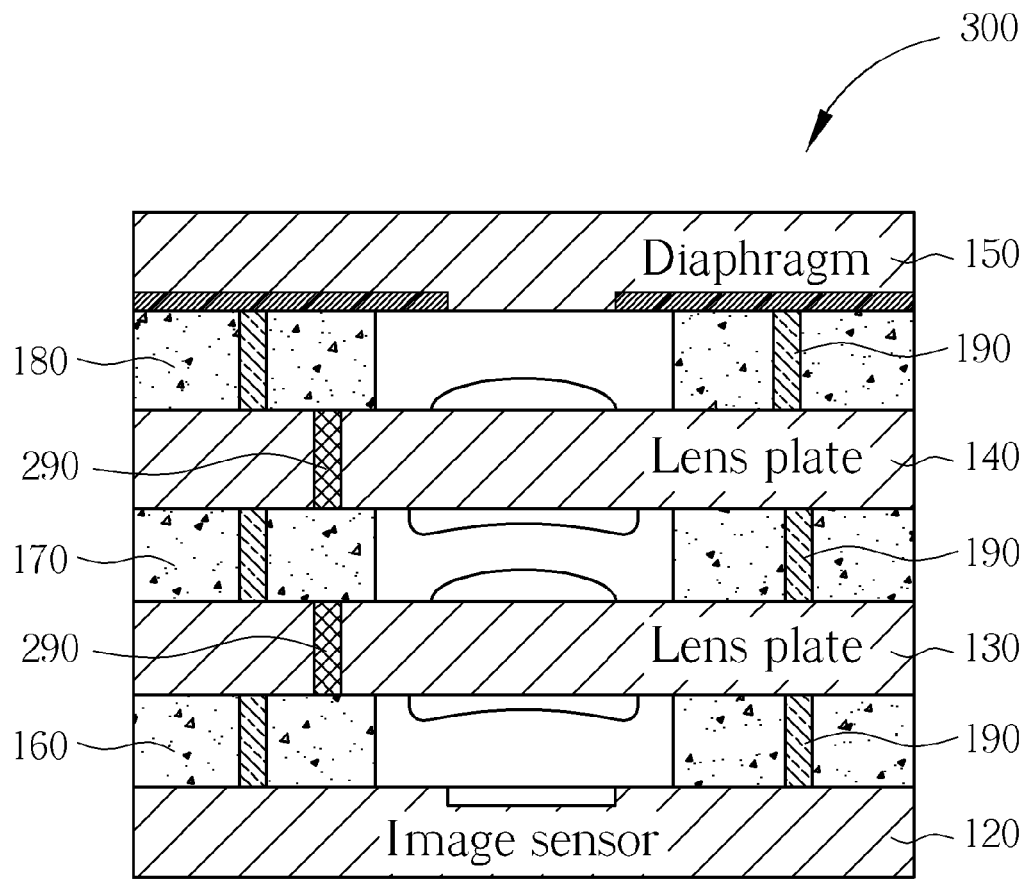
FIG. 3 is a cross-sectional view of an architecture of an optical lens on wafer level according to a third embodiment of the present invention.

FIG. 3 is a cross-sectional view of an architecture of an optical lens on wafer level according to a third embodiment of the present invention. As shown in FIG. 3, the architecture of the optical lens 300 on wafer level is similar to that of the optical lens 100 shown in FIG. 1 or the optical lens 200 shown in FIG. 2. The optical lens 300 is an embodiment by combining the architectures of the optical lens 100 and the optical lens 200. In this embodiment, the optical lens 300 includes a plurality of optical components 120-150, a plurality of spacers 160-180, at least one via plug 190, and at least one via plug 290. Be noted not, the first spacer 160, the second spacer 170 and the third spacer 180 each has at least one via plug 190 passing through them; and the first lens plate 130 and the second lens plate 140 each has at least one via plug 290 passing through them. In other words, any optical component (e.g., 130 and 140), which is located in between two spacers, may have at least one via plug 290 passing through it; additionally, any spacer (e.g., 160-180) which is located in between two optical components for separating these two optical components may have at least one via plug 190 passing through it as well.

The abovementioned embodiments are presented merely to illustrate practicable designs of the present invention, and in no way should be considered to be limitations of the scope of the present invention. Those skilled in the art should appreciate that various modifications of the optical lens 100-300 shown in FIG. 1-FIG. 3 may be made without departing from the spirit of the present invention.

Figure 4:
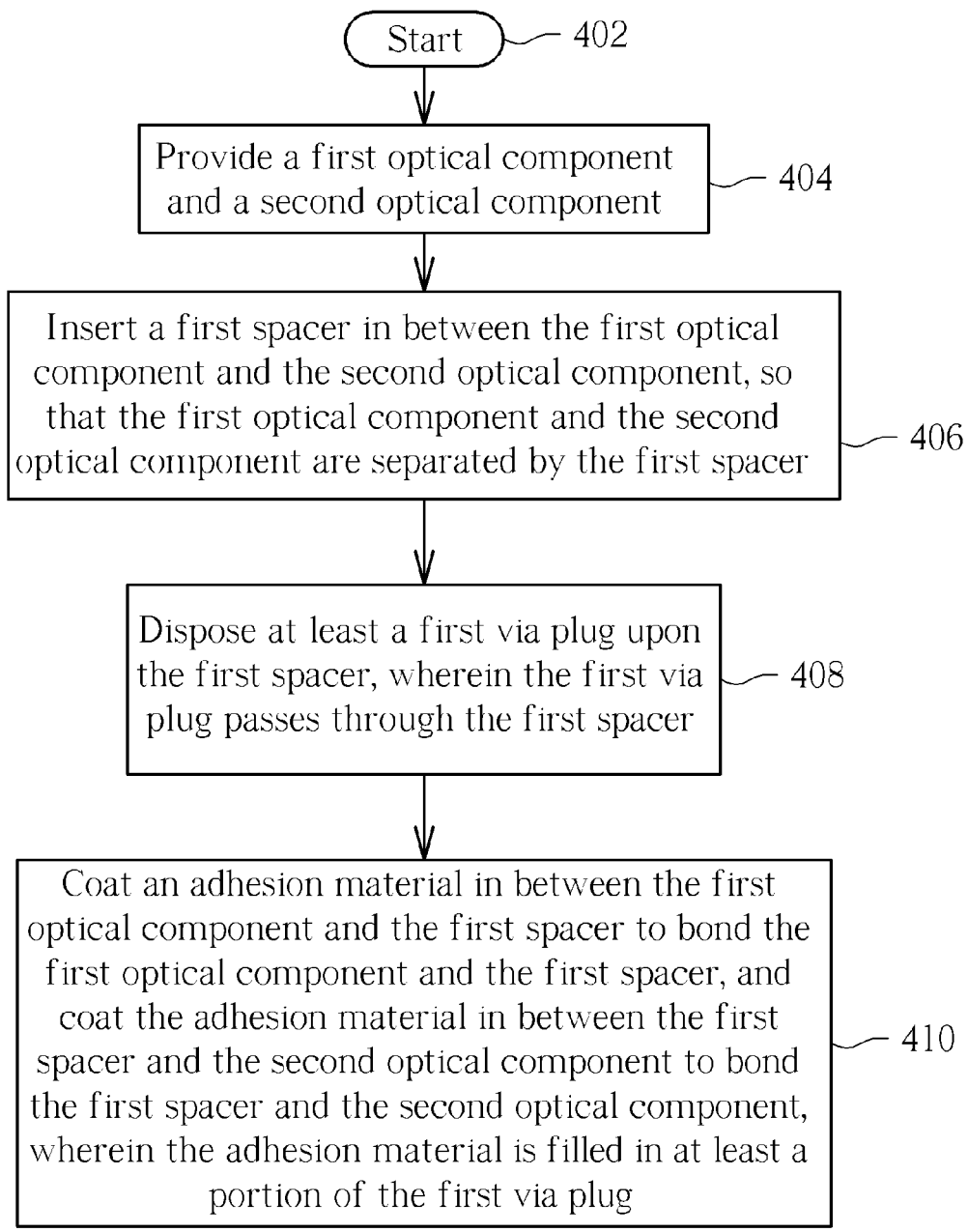
FIG. 4 is a flowchart illustrating a method for forming an optical lens on wafer level according to an exemplary embodiment of the present invention.

FIG. 4 is a flowchart illustrating a method for forming an optical lens on wafer level according to an exemplary embodiment of the present invention. Please note that the following steps are not limited to be performed according to the exact sequence shown in FIG. 4 if a roughly identical result can be obtained. The method includes, but is not limited to, the following steps:

Step 402: Start.

Step 404: Provide a first optical component and a second optical component.

Step 406: Insert a first spacer in between the first optical component and the second optical component, so that the first optical component and the second optical component are separated by the first spacer.

Step 408: Dispose at least a first via plug upon the first spacer, wherein the first via plug passes through the first spacer.

Step 410: Coat an adhesion material in between the first optical component and the first spacer to bond the first optical component and the first spacer, and coat the adhesion material in between the first spacer and the second optical component to bond the first spacer and the second optical component, wherein the adhesion material is filled in at least a portion of the first via plug.

Operations of manufacturing an optical lens (e.g. 100) on wafer level can be known by collocating the steps shown in FIG. 4 together with the components shown in FIG. 1. And further description of each step shown in FIG. 4 is therefore omitted here for brevity.

Figure 5:
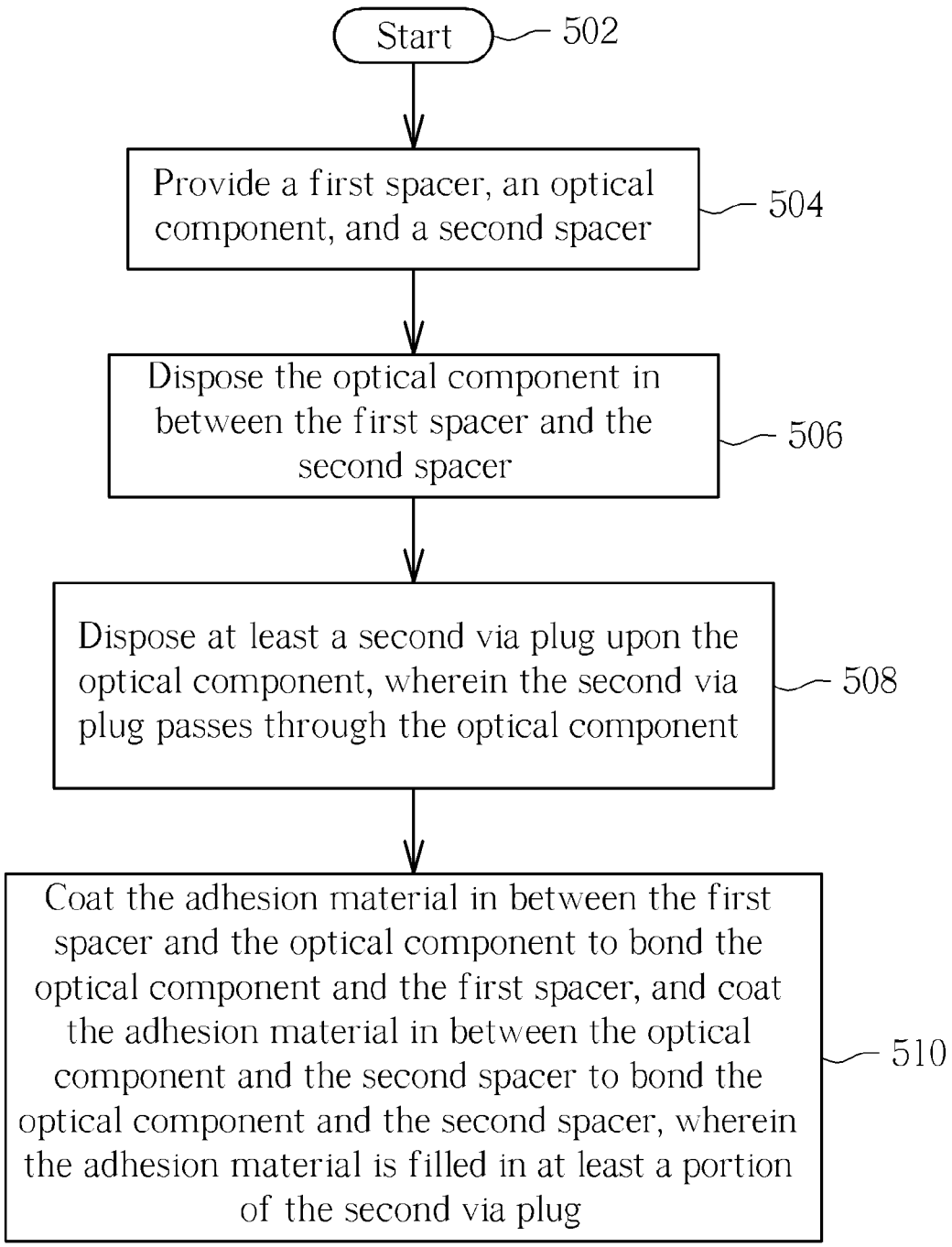
FIG. 5 is a flowchart illustrating a method for forming an optical lens on wafer level according to another exemplary embodiment of the present invention.

FIG. 5 is a flowchart illustrating a method for forming an optical lens on wafer level according to another exemplary embodiment of the present invention. The method includes, but is not limited to, the following steps:

Step 502: Start.

Step 504: Provide a first spacer, an optical component, and a second spacer.

Step 506: Dispose the optical component in between the first spacer and the second spacer.

Step 508: Dispose at least a second via plug upon the optical component, wherein the second via plug passes through the optical component.

Step 510: Coat the adhesion material in between the first spacer and the optical component to bond the optical component and the first spacer, and coat the adhesion material in between the optical component and the second spacer to bond the optical component and the second spacer, wherein the adhesion material is filled in at least a portion of the second via plug.

Operations of manufacturing an optical lens (e.g. 200) on wafer level can be known by collocating the steps shown in FIG. 5 together with the components shown in FIG. 2. And further description of each step shown in FIG. 5 is therefore omitted here for brevity.

Please note that, the steps of the abovementioned flowcharts are merely exemplary embodiments of the present invention, and in no way should be considered to be limitations of the scope of the present invention. These methods can include other intermediate steps or can merge several steps into a single step without departing from the spirit of the present invention. Those skilled in the art should observe that various modifications of these methods may be made. For example, the steps shown in FIG. 4 and the steps shown in FIG. 5 can be merged into a new varied embodiment.

The abovementioned embodiments are presented merely for describing features of the present invention, and in no way should be considered to be limitations of the scope of the present invention. In summary, the present invention provides an optical lens on wafer level and a related method for forming the optical lens. By filling the first via plugs 190 with adhesion material in between any two optical components and/or by filling the second via plugs 290 with adhesion material in between any two spacers, the adhesion between them can be improved. Therefore, the optical lens on wafer level can successfully pass the quality test during the manufacturing process. Furthermore, since the optical lens disclosed in the present invention has the advantages of easy design and simple manufacturing, no extra cost is required.

Those skilled in the art will readily observe that numerous modifications and alterations of the device and method may be made while retaining the teachings of the invention.

What is claimed is:

1. An optical lens on wafer level, comprising:
    a first optical component;
    a second optical component;
    a first spacer, comprising at least a first via plug passing through the first spacer, wherein the first optical component and the second optical component are separated by the first spacer; and
    an adhesion material, coated in between the first optical component and the first spacer, coated in between the first spacer and the second optical component, and filled in at least a portion of the first via plug.

2. The optical lens of claim 1, further comprising:
    a third optical component; and
    a second spacer, wherein the second optical component and the third optical component are separated by the second spacer;
    wherein the second optical component, which is located in between the first spacer and the second spacer, further comprises at least a second via plug passing through the second optical component;
    wherein the adhesion material is further coated in between the second optical component and the second spacer, and filled in at least a portion of the second via plug.

3. The optical lens of claim 1, wherein the first optical component comprises a diaphragm, a lens plate, or an image sensor.

4. The optical lens of claim 1, wherein the second optical component comprises a diaphragm, a lens plate, or an image sensor.

5. The optical lens of claim 1, wherein the optical lens is a compact camera module (CCM).

6. The optical lens of claim 1, wherein the optical lens is disposed in an image-capturing device.

7. An optical lens on wafer level, comprising:
    a first spacer;
    a second spacer;
    an optical component, located in between the first spacer and the second spacer, wherein the optical component comprises at least one via plug passing through the optical component; and
    an adhesion material, coated in between the first spacer and the optical component, coated in between the optical component and the second spacer, and filled in at least a portion of the via plug.

8. The optical lens of claim 7, wherein the optical component comprises a lens plate.

9. The optical lens of claim 7, wherein the optical lens is a compact camera module (CCM).

10. The optical lens of claim 7, wherein the optical lens is disposed in an image-capturing device.

11. A method for forming an optical lens on wafer level, comprising:
    providing a first optical component and a second optical component;
    inserting a first spacer in between the first optical component and the second optical component, so that the first optical component and the second optical component are separated by the first spacer;
    disposing at least a first via plug upon the first spacer, wherein the first via plug passes through the first spacer; and
    coating an adhesion material in between the first optical component and the first spacer to bond the first optical component and the first spacer, and coating the adhesion material in between the first spacer and the second optical component to bond the first spacer and the second optical component, wherein the adhesion material is filled in at least a portion of the first via plug.

12. The method of claim 11, further comprising:
    providing a third optical component;
    inserting a second spacer in between the second optical component and the third optical component, so that the second optical component and the third optical component are separated by the second spacer;
    disposing at least one second via plug upon the second optical component, wherein the second plug passes through the second optical component; and
    coating the adhesion material in between the second optical component and the second spacer to bond the second optical component and the second spacer, and coating the adhesion material in between the second optical component and the first spacer to bond the second optical component and the first spacer, wherein the adhesion material is filled in at least a portion of the second via plug.

13. The method of claim 11, wherein the first optical component comprises a diaphragm, a lens plate, or an image sensor.

14. The method of claim 11, wherein the second optical component comprises a diaphragm, a lens plate, or an image sensor.

15. The method of claim 11, wherein the optical lens is a compact camera module (CCM).

16. The method of claim 11, wherein the optical lens is disposed in an image-capturing device.

* * * * *